(12) United States Patent
Guo

(10) Patent No.: US 11,404,666 B2
(45) Date of Patent: Aug. 2, 2022

(54) ORGANIC LIGHT EMITTING DIODE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Tianfu Guo, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 350 days.

(21) Appl. No.: 16/487,748

(22) PCT Filed: Dec. 25, 2018

(86) PCT No.: PCT/CN2018/123525
§ 371 (c)(1),
(2) Date: Aug. 21, 2019

(87) PCT Pub. No.: WO2020/077839
PCT Pub. Date: Apr. 23, 2020

(65) Prior Publication Data
US 2021/0359258 A1 Nov. 18, 2021

(30) Foreign Application Priority Data
Oct. 17, 2018 (CN) .......................... 201811206456.8

(51) Int. Cl.
*H01L 29/08* (2006.01)
*H01L 51/52* (2006.01)
(Continued)

(52) U.S. Cl.
CPC ...... *H01L 51/5253* (2013.01); *H01L 51/0034* (2013.01); *H01L 51/5246* (2013.01); *H01L 51/56* (2013.01); *H01L 2251/303* (2013.01)

(58) Field of Classification Search
None
See application file for complete search history.

(56) References Cited

U.S. PATENT DOCUMENTS 9,997,427 B2 * 6/2018 Chen .................. H01L 27/1248
2016/0365395 A1 12/2016 Xu et al.
2018/0247980 A1 8/2018 Jang et al.

FOREIGN PATENT DOCUMENTS

CN 104900681 A 9/2015
CN 206976349 U 2/2018
(Continued)

*Primary Examiner* — Hung K Vu
(74) *Attorney, Agent, or Firm* — Benesch, Friedlander, Coplan & Aronoff LLP

(57) ABSTRACT

The present invention provides an organic light emitting diode (OLED) display panel and a manufacturing method thereof. The display panel includes a display structure and an encapsulation structure, the display structure includes a display region and an edged non-display region surrounding the display region, the display region includes an OLED layer, the encapsulation structure is disposed on the edged non-display region; wherein the encapsulation structure includes a buffer strip connected to the display region and a sealing layer covering the display region and the buffer strip; wherein a surface of the buffer strip has an uneven three-dimensional structure.

16 Claims, 5 Drawing Sheets

(51) Int. Cl.
 *H01L 51/00* (2006.01)
 *H01L 51/56* (2006.01)

(56) References Cited

FOREIGN PATENT DOCUMENTS

| CN | 108110147 A | 6/2018 |
| CN | 108281458 A | 7/2018 |

* cited by examiner

ORGANIC LIGHT EMITTING DIODE DISPLAY PANEL AND MANUFACTURING METHOD THEREOF

CROSS REFERENCE TO RELATED APPLICATION

This application claims the priority of International Application No. PCT/CN2018/123525, filed on 2018 Dec. 25, which claims priority to Chinese Application No. 201811206456.8, filed on 2018 Oct. 17. The entire disclosures of each of the above applications are incorporated herein by reference.

BACKGROUND OF INVENTION

Field of Invention

The present invention relates to a field of display technologies, in particular to an organic light emitting diode display panel, and a manufacturing method thereof.

Description of Prior Art

Organic light emitting diode (OLED) display screens are widely used in display fields, and generally employ a top-emitting device structure. An OLED composes an anode, an organic layer, and a cathode. The organic layer includes an electric hole injection layer, an electric hole transport layer, an organic light-emitting layer, an electron transport layer, and an electron injection layer.

Because the organic light-emitting layer and the cathode are very sensitive to water and oxygen, it is important to prevent water and oxygen from invading into the organic light-emitting layer in the OLED. OLED devices are currently protected by thin film encapsulation (TFE). For TFE technology, the most important is its water and oxygen blocking performance, and the optical penetration and flexible bending properties of the TFE film layer are taken into account as well. For OLED devices, an external water and oxygen intrusion pathway can be divided into two categories: one way is that water and oxygen are directly penetrated into the TFE film layer from top to bottom of the OLED devices; another way is that water and oxygen are penetrated into TFE film layer from sides of the OLED devices. For common TFE structure, it usually prevents water and oxygen from eroding the OLED devices by the first way. As a result, water and oxygen can invade the OLED devices through the second way. An existing method of blocking water and oxygen from the second pathway is to provide a sandwich structure of an inorganic barrier layer/an organic buffer layer/an inorganic barrier layer on the periphery of the OLED devices. Among the three layers, the organic buffer layer is the weakest in terms of blocking water and oxygen, and water and oxygen can pass through it relatively easily. Therefore, in the design of an encapsulation structure, it is necessary to make sure that the organic buffer layer is completely covered by the first inorganic barrier layer and the second inorganic barrier layer. However, the boundary control for setting the organic buffer layer is not perfect enough at present, and it is difficult to completely cover the organic buffer layer with the first inorganic barrier layer and the second inorganic barrier layer without the organic buffer layer overflowing.

SUMMARY OF INVENTION

The present invention provides an organic light emitting diode display panel and a manufacturing method thereof, which is used to solve the technical problem of the organic layer overflowing in the encapsulation layer of the display surface of the OLED in the prior art.

In order to solve the above problems, the present invention provides an OLED display panel, wherein the display panel comprises a display structure and an encapsulation structure, the display structure comprising a display region and an edged non-display region surrounding the display region, the display region comprising an OLED layer, the encapsulation structure being disposed on the edged non-display region:

wherein the encapsulation structure comprises a buffer strip connected to the display region and a sealing layer covering the display region and the buffer strip;

wherein a surface of the buffer strip has an uneven three-dimensional structure, the three-dimensional structure has protruded portions and recessed portions, and the protruded portions and the recessed portions are uniformly arranged and spaced apart from each other; and wherein the encapsulation structure further comprises at least one annular dam surrounding the buffer strip, and the dam is positioned below the sealing layer.

According to one aspect of the invention, the sealing layer comprises a first barrier layer directly covering the display region and the buffer strip, and a second barrier layer over the first barrier layer.

According to one aspect of the invention, the first barrier layer is an inorganic thin film, a material of the first barrier layer is any one of silicon nitride, silicon oxynitride, silicon carbonitride, silicon oxide, and aluminum oxide, and the second barrier layer is an organic film, a material of the organic film is a polyester woven fabric or a fluorocarbon polymer.

According to one aspect of the invention, A sealing layer further comprises a third barrier layer above the second barrier layer, the third barrier layer is an inorganic thin film, and a material of the third barrier layer is any one of silicon nitride, silicon oxynitride, silicon carbonitride, silicon oxide, and aluminum oxide.

According to one aspect of the invention, the sealing layer further comprises a first buffer layer between the first barrier layer and the second barrier layer, and the first buffer layer is a layer of hydrophobic material having a porous structure.

According to one aspect of the invention, the sealing layer further comprises a second buffer layer between the second barrier layer and the third barrier layer, and the second buffer layer is a layer of hydrophobic material having a porous structure.

According to one aspect of the invention, the material of the first buffer layer and the second buffer layer has water contact angles greater than 140°.

According to one aspect of the invention, the material of the first buffer layer and the second buffer layer is a polyester textile or a fluorocarbon polymer.

In order to solve the above problems, the present invention further provides an OLED panel, the display panel comprises: a display structure and an encapsulation structure, the display structure comprising a display region and an edged non-display region surrounding the display region, the display region comprising an OLED layer, the encapsulation structure being disposed on the edged non-display region;

wherein the encapsulation structure comprises a buffer strip connected to the display region and a sealing layer covering the display region and a buffer strip;

wherein a surface of the buffer strip has an uneven three-dimensional structure, the three-dimensional structure has protruded portions and recessed portions, and the protruded portions and the recessed portions are uniformly arranged and spaced apart from each other.

According to one aspect of the invention, the encapsulation structure further comprises at least one annular dam surrounding the buffer strip, and the dam is positioned below the sealing layer.

According to one aspect of the invention, the sealing layer comprises a first barrier layer directly covering the display region and the buffer strip, and a second barrier layer over the first barrier layer.

According to one aspect of the invention, the first barrier layer is an inorganic thin film, a material of the first barrier layer is any one of silicon nitride, silicon oxynitride, silicon carbonitride, silicon oxide, and aluminum oxide, and the second barrier layer is an organic film, and a material of the second barrier layer is a polyester woven fabric or a fluorocarbon polymer.

According to one aspect of the invention, the sealing layer further comprises a third barrier layer above the second barrier layer, the third barrier layer is an inorganic thin film, and a material of the third barrier layer is any one of silicon nitride, silicon oxynitride, silicon carbonitride, silicon oxide, and aluminum oxide.

According to one aspect of the invention, the sealing layer further comprises a first buffer layer between the first barrier layer and the second barrier layer, and the first buffer layer is a layer of hydrophobic material having a porous structure.

According to one aspect of the invention, the sealing layer further comprises a second buffer layer between the second barrier layer and the third barrier layer, and the second buffer layer is a layer of hydrophobic material having a porous structure.

According to one aspect of the invention, materials of both the first buffer layer and the second buffer layer have a water contact angles greater than 140°.

According to one aspect of the invention, materials of each of the first buffer layer and the second buffer layer are polyester textiles or a fluorocarbon polymers.

In order to solve the above problems, the present invention further provides a method of fabricating an OLED panel, wherein the method comprises the steps of:

providing a substrate;

forming a display structure on the substrate, the display structure comprising a display region and an edged non-display region surrounding the display region, the display region comprising an OLED:

providing a buffer strip connected to the display region and the non-display region, a surface of the buffer strip has an uneven three-dimensional structure, the three-dimensional structure has protruded portions and recessed portions, and the protruded portions and the recessed portions are uniformly arranged and spaced apart from each other;

forming a dam surrounding the buffer strip:

forming a sealing layer covering the display region, the buffer strip, and the dam, the sealing layer comprising a first barrier layer directly covering the display region, the buffer strip and the dam, a second barrier layer positioned above the first barrier layer, and a third barrier layer positioned above the second barrier layer.

The present invention provides a buffer strip connected to the display area on the non-display region, the surface of the buffer strip has an uneven structure which is matched with a porous hydrophobic film layer disposed between the organic buffer layer and the inorganic buffer layer, thus the leveling property of the organic buffer layer in this region can be excellently limited to prevent the organic buffer layer from overflowing the barrier wall. By properly designing the size and depth of the grooves on the surface of the buffer strip, and combining with improving the material of the organic hydrophobic layer, the organic buffer layer can be completely confined within the range of the buffer strip, thereby the use of the barrier wall can be eliminated, and the package structure can be greatly improved.

BRIEF DESCRIPTION OF DRAWINGS

FIG. 4A, FIG. 4B, FIG. 6A, FIGS. 6B to 10A and 10B are structural diagrams of a region between an AA region and an edge of an OLED display in a method of fabricating an OLED display panel in an embodiment of the present invention.

DETAILED DESCRIPTION OF PREFERRED EMBODIMENTS

Figure 1:
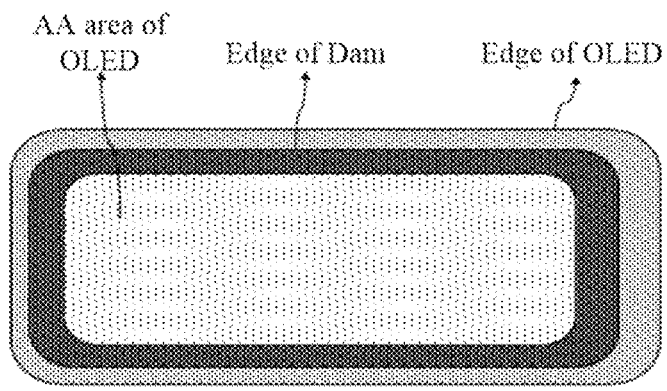
FIG. 1 is a top view of an organic light emitting diode (OLED) display in prior art.

Description of the following embodiment, with reference to accompanying drawings, is used to exemplify specific embodiments which may be carried out in the present disclosure. Directional terms mentioned in the present disclosure, such as "top". "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, prior art will be briefly described. Referring to FIG. 1, FIG. 1 is a top view of an OLED display in the prior art. Wherein, the OLED devices comprise a centrally located active area (AA area), an encapsulation barrier wall (Dam) surrounding the AA area, and an outer encapsulation area surrounding the Dam.

Figure 2:
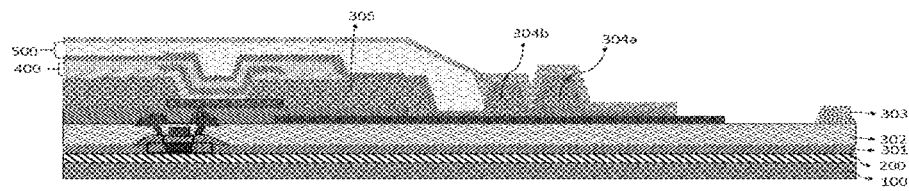
FIG. 2 is a structural diagram of a region between an AA region and an edge of an OLED display of prior art.

FIG. 2 is a structural diagram of a region between an AA region and an edge of an organic light emitting diode (OLED) display of prior art. The OLED display includes a glass substrate 100, a flexible substrate 200, a thin film transistor layer 301, a gate dielectric layer 302, a crack barrier layer 303, a first barrier wall 304a, a second barrier wall 304b, a pixel defining layer 305, a light emitting layer 400, and an encapsulation layer 500. In order to prevent the organic buffer layer (ink) from overflowing the defined area in a thin film encapsulation (TFE) process, it is common to make multiple barrier walls around the OLED devices. For OLED devices, a future development trend is that the border is getting narrower and narrower, so the number of the barrier walls will be less and less (or even eliminated). Because a main function of the barrier walls is to limit the organic buffer layer in the sealing layer between the AA area and the barrier wall, it is necessary to propose a method capable of effectively confining the organic buffer layer in a specified area to reduce the number of barrier walls.

In order to solve the above problems, the present invention provides an OLED display panel, wherein the display panel comprises a display structure and an encapsulation structure, the display structure comprising a display region and an edged non-display region surrounding the display region, the display region comprising an OLED layer, the encapsulation structure being disposed on the edged non-display region; wherein the encapsulation structure comprises a buffer strip connected to the display region and a sealing layer covering the display region and the buffer strip; wherein a surface of the buffer strip has an uneven three-dimensional structure, the three-dimensional structure has protruded portions and recessed portions, and the protruded portions and the recessed portions are uniformly arranged and spaced apart from each other.

Figure 10A:
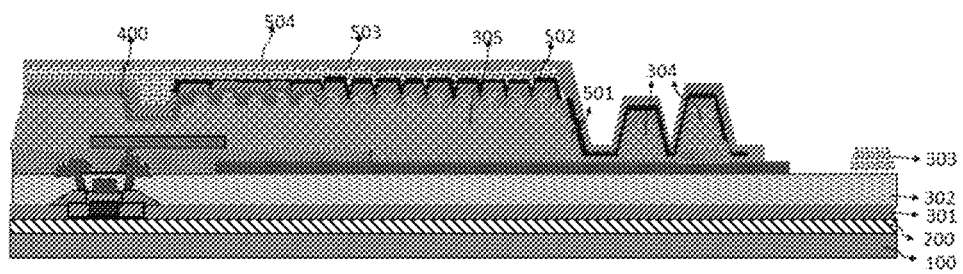
Figure 10B:
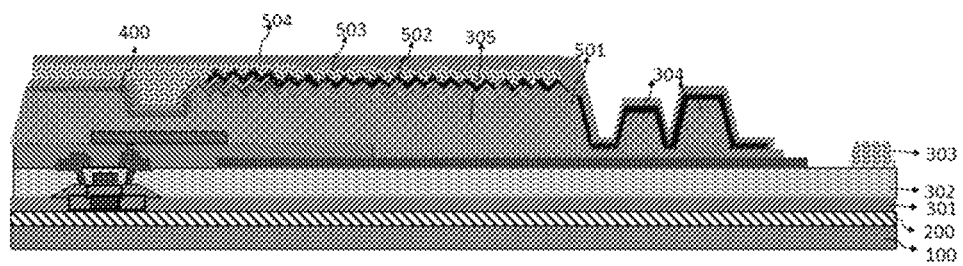

Specifically, as shown in FIG. 10A and FIG. 10B, the display panel includes a glass substrate 100, a flexible substrate 200, a thin film transistor layer 301, a gate dielectric layer 302, a crack blocking layer 303, a pixel defining layer 305, a light emitting layer 400, and an encapsulation structure. Wherein, the pixel defining layer 305 and the light emitting layer 400 defines a display region; a buffer strip connected to the pixel defining layer 305 and a sealing layer covering the pixel defining layer 305 and the buffer strip compose the encapsulation structure. Preferably, in this embodiment, the encapsulation structure further comprises at least one annular barrier wall 304 surrounding the buffer strip, the barrier wall 304 being located below the sealing layer.

A surface of the buffer strip has an uneven three-dimensional structure, the three-dimensional structure has protruded portions and recessed portions, and the protruded portions and the recessed portions are uniformly arranged and spaced apart from each other. The uneven three-dimensional structure could have a cylindrical protrusion as shown in FIG. 10A, the uneven three-dimensional structure can also have a triangular shape as shown in FIG. 10B. Preferably, as shown in FIG. 5A to FIG. 5F, in different embodiments, the surface of the buffer strip could have a three-dimensional structure in different shapes and arrangements.

Figure 5A:
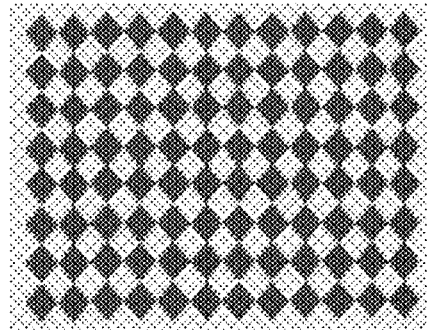
FIG. 5A to FIG. 5F are structural diagrams of an uneven structure of a surface of a buffer strip in different embodiments of the present invention.

Specifically, the protruded portions and recessed portions could be a rectangular structure that is arranged in a cross arrangement. As shown in FIG. 5A, two adjacent rectangular structures are protruded portions and recessed portions, respectively. Wherein, apex angles of adjacent rectangular structures constituting the protruded portions are connected to each other, and apex angles of adjacent rectangular structures constituting the recessed portions are connected to each other to form a three-dimensional structure.

Figure 5B:
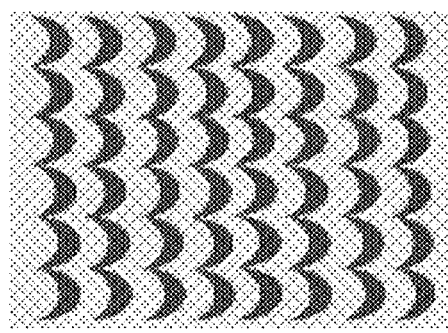

Protruded portions and recessed portions in FIG. 5B are arranged in parallel strips. Specifically, the protruded portions of each strip are formed by adjacent meniscus structures, the plurality of strips of the protruded portions are spaced apart, and regions between the protruded portions constitute the recessed portions.

Figure 5C:
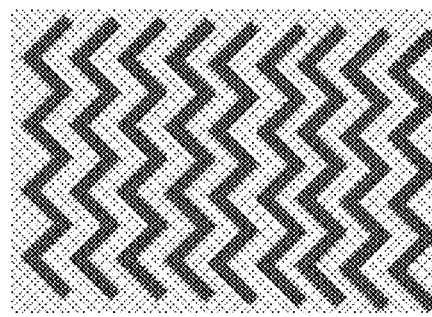

Protruded portions and recessed portions in FIG. 5C are arranged in parallel strips. Specifically, the protruded portions of each strip are formed by adjacent triangular structures, the plurality of strips of the protruded portions are spaced apart, and regions between the protruded portions constitute the recessed portions.

Figure 5D:
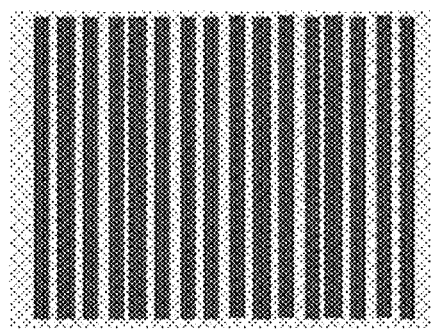

Protruded portions and recessed portions in FIG. 5D are arranged in parallel strips. Specifically, the protruded portions of each strip are formed by linear structures, the plurality of strips of the protruded portions are spaced apart, and regions between the protruded portions constitute the recessed portions. The linear structure is simple in manufacturing process, but the corresponding blocking effect is not as good as the above structures, and in practice, a suitable shape can be selected as needed.

Figure 5E:
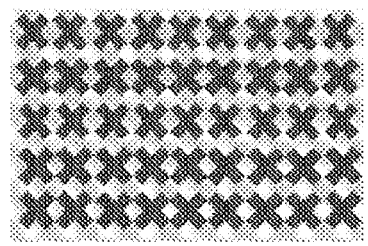

Protruded portions and recessed portions in FIG. 5E are cross-shaped structures which are independent from each other, the cross-shaped structures are repeatedly arranged to constitute the protruded portions, and regions between the protruded portions constitute the recessed portions.

Figure 5F:
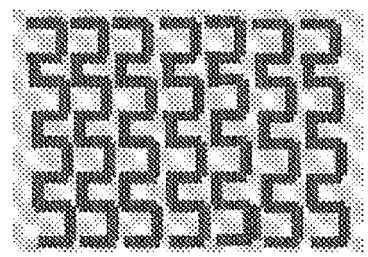

Protruded portions and recessed portions in FIG. 5F are arranged in parallel strips. Specifically, the protruded portions of each strip are formed by bent linear structures, the plurality of strips of the protruded portions are spaced apart, and regions between the protruded portions constitute the recessed portions.

The above embodiments are merely illustrative explanations of the protruded portions and recessed portions of the three-dimensional structure, in practice, the three-dimensional structure may have other implementations, and a suitable three-dimensional structure may be selected according to needs of encapsulation, process complexity, and implementation cost.

Specifically, referring to FIG. 10A, an encapsulation layer includes a first barrier layer 501 directly covering a display region and a buffer strip, and a second barrier layer 503 located above the first barrier layer. The first barrier layer 501 is an inorganic thin film, and a material thereof is any one of silicon nitride, silicon oxynitride, silicon carbonitride, silicon oxide, and aluminum oxide; the second barrier layer 503 is an organic film, and a material thereof is a polyester textile or a fluorocarbon polymer. Specifically, the encapsulation layer further includes a third barrier layer 504 located above the second barrier layer, the third barrier layer 504 is an inorganic thin film, and a material thereof is any one of silicon nitride, silicon oxynitride, silicon carbonitride, silicon oxide, and aluminum oxide.

Preferably, the encapsulation layer further includes a first buffer layer 502 between the first barrier layer 501 and the second barrier layer 503, and the first buffer layer 502 is a hydrophobic material layer having a porous structure.

Preferably, in other embodiments, the encapsulation layer further includes a second buffer layer (not shown) between the second barrier layer 503 and the third barrier layer 504, the second buffer layer is a layer of hydrophobic material having a porous structure.

Wherein, the water contact angle of the material of the first buffer layer 502 and the second buffer layer is greater than 140°, preferably, the material of the first buffer layer 502 and the second buffer layer is a polyester textile or a fluorocarbon polymer.

The present invention provides a buffer strip connected to a display area on a non-display region, a surface of the buffer strip has an uneven structure which is matched with a porous hydrophobic film layer disposed between an organic buffer layer and an inorganic buffer layer, thus a leveling property of the organic buffer layer in this region can be excellently limited to prevent the organic buffer layer from overflowing the barrier wall. By properly designing the size and depth of grooves on the surface of the buffer strip, a material of an organic hydrophobic layer is improved comprehensively, the organic buffer layer can be completely confined within the range of the buffer strip, thereby the use of the barrier wall can be eliminated, and the package structure can be greatly improved.

The present invention further provides a method of fabricating an organic light emitting diode (OLED) display panel, wherein the method comprises the steps of:
  providing a substrate;
  forming a display structure on the substrate, the display structure comprising a display region and an edged non-display region surrounding the display region, the display region comprising an OLED layer;

providing a buffer strip connected to the display area on the non-display region, a surface of the buffer strip has an uneven three-dimensional structure, the three-dimensional structure has protruded portions and recessed portions, and the protruded portions and the recessed portions are uniformly arranged and spaced apart from each other;

forming a dam surrounding the buffer strip:

forming a sealing layer covering the display region, the buffer strip, and the dam, the sealing layer comprising a first barrier layer directly covering the display region, the buffer strip and the dam, a second barrier layer positioned above the first barrier layer, and a third barrier layer positioned above the second barrier layer.

The above method will be described in detail below with reference to the accompanying drawings.

Figure 3:
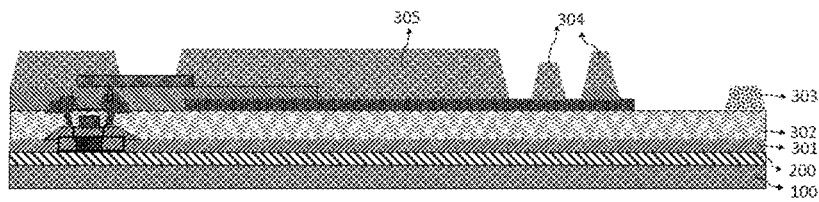
FIG. 3.

Referring to FIG. 3, first, a flexible material is coated on a clean glass substrate 100, and a flexible substrate 200 is obtained by a high temperature curing process. A complete thin film transistor process is continued to obtain an OLED structure as shown in FIG. 3. The display panel includes a glass substrate 100, a flexible substrate 200, a thin film transistor layer 301, a gate dielectric layer 302, a crack blocking layer 303, a barrier wall 304, and a pixel defining layer 305.

Figure 4A:
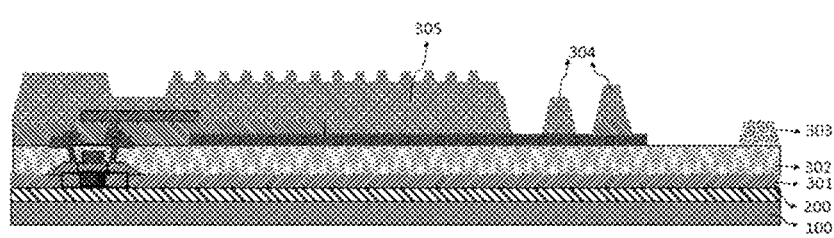
Figure 4B:
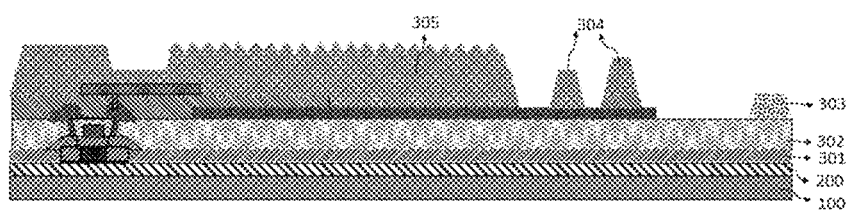

Thereafter, a buffer strip between the barrier wall 304 and the pixel defining layer 305 is photolithographed, forming an uneven three-dimensional structure on a surface of the buffer strip, the three-dimensional structure has protruded portions and recessed portions, and the protruded portions and the recessed portions are uniformly arranged and spaced apart from each other. The uneven three-dimensional structure may have a cylindrical protrusion, as shown in FIG. 4A, or may have a triangular protrusion, as shown in FIG. 4B. Preferably, as shown in FIG. 5A to 5F, in different embodiments, the surface of buffer strip may have a three-dimensional structure of different shapes and arrangements.

Figure 6A:
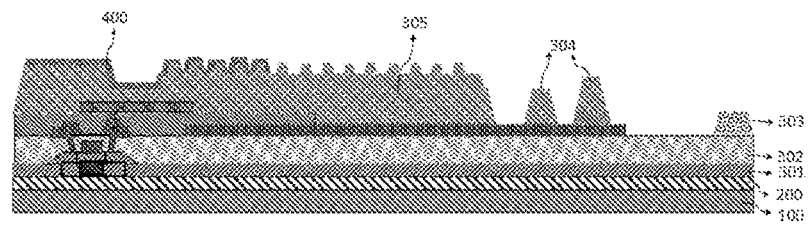
Figure 6B:
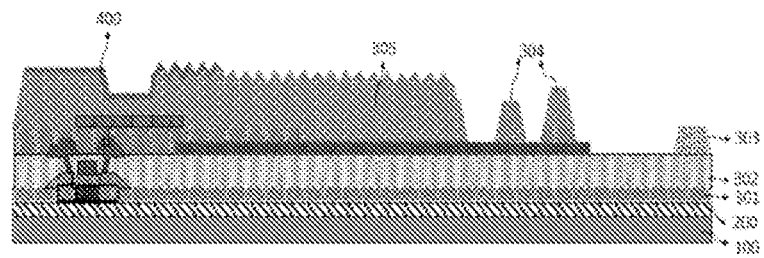
Figure 7A:
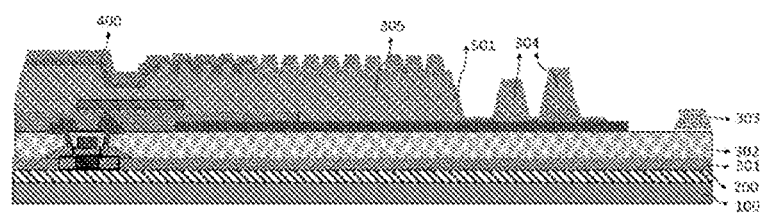
Figure 7B:
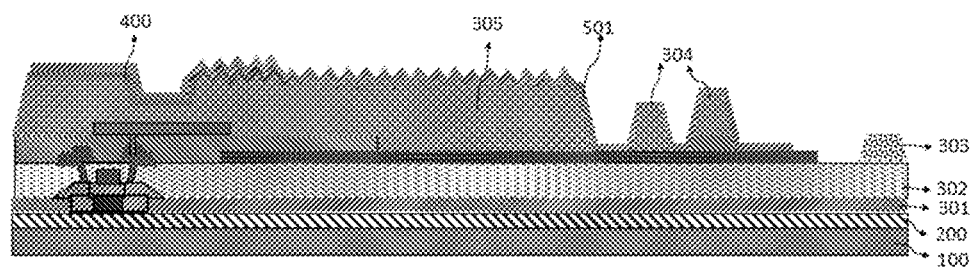

Thereafter, a light-emitting layer 400 is formed on the surfaces of the above structure as shown in FIGS. 6A and 6B. After the light-emitting layer 400 is formed, a sealing layer is formed on the above structure. First, as shown in FIGS. 7A and 7B, a first barrier layer 501 directly covering the light-emitting layer and a buffer tape is formed, the first barrier layer 501 is an inorganic thin film, and a material thereof is any one of silicon nitride, silicon oxynitride, silicon carbonitride, silicon oxide, and aluminum oxide.

Figure 8A:
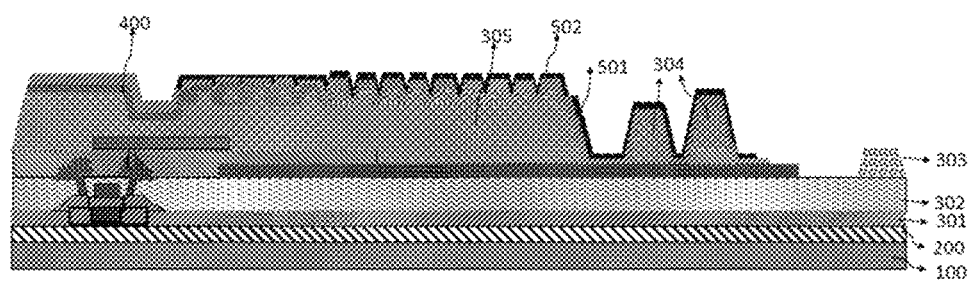
Figure 8B:
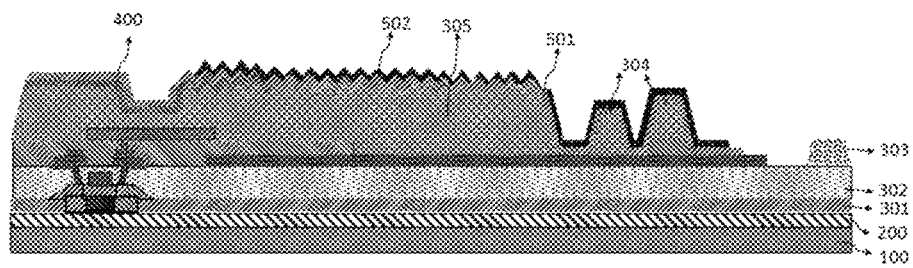

Thereafter, as shown in FIG. 8(a) and FIG. 8(b), a first buffer layer 502 is formed over a first barrier layer 501, and the first buffer layer 502 is a hydrophobic material layer having a porous structure. Wherein, a water contact angle of a material of the first buffer layer 502 and a second buffer layer is greater than 140°, preferably, the material of the first buffer layer 502 and the second buffer layer is a polyester textile or a fluorocarbon polymer.

Figure 9A:
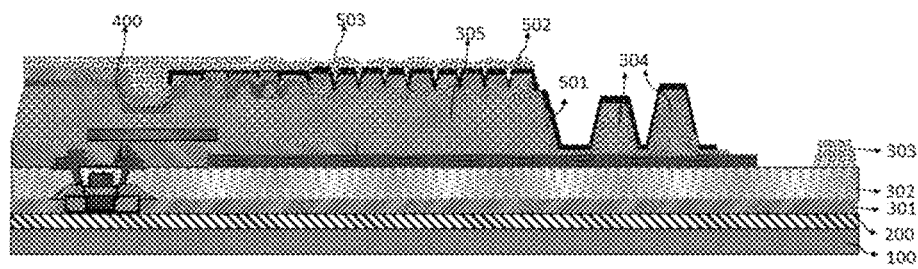
Figure 9B:
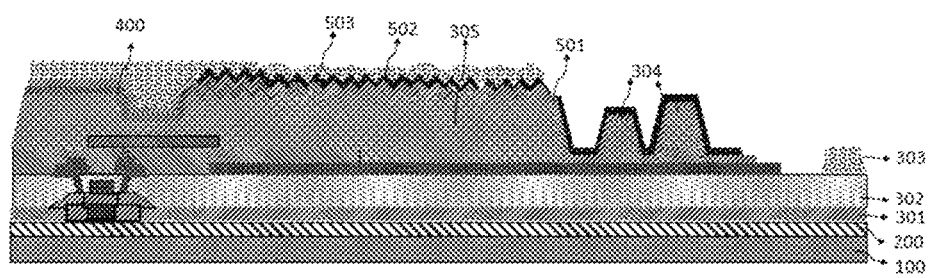

Thereafter, as shown in FIG. 9A and FIG. 9B, a second barrier layer 503 is formed on a first buffer layer 502, the second barrier layer 503 is an organic film, a material of the second barrier layer 503 is a polyester textile or a fluorocarbon polymer.

A material of the first buffer layer 502 is a polyester textile or a fluorocarbon polymer, its surface is porous, and has a strong hydrophobic property. The first buffer layer contains many strong polar functional groups and is extremely hydrophilic. Therefore, the use of the porous hydrophobic material, combined with a groove pattern formed on a lower buffer strip, can perfectly limit leveling performance of the organic buffer layer in the region, and prevent the organic buffer layer from overflowing the barrier wall. By properly designing the size and depth of the groove of the lower pixel defining layer, an organic hydrophobic layer material is improved comprehensively, the organic buffer layer can be completely confined within the pixel defining layer, and a use of the barrier wall can be eliminated.

Thereafter, as shown in FIG. 10A and FIG. 10B, the third barrier layer 504 is formed over the second barrier layer 503, the third barrier layer 504 is an inorganic thin film, and a material thereof is any one of silicon nitride, silicon oxynitride, silicon carbonitride, silicon oxide, and aluminum oxide.

The present invention provides a buffer strip connected to a display area on a non-display region, a surface of the buffer strip has an uneven structure which is matched with a porous hydrophobic film layer disposed between an organic buffer layer and an inorganic buffer layer, thus the leveling property of the organic buffer laver in this region can be excellently limited to prevent the organic buffer layer from overflowing a barrier wall. By properly designing the size and depth of grooves on a surface of the buffer strip, a material of an organic hydrophobic layer is improved comprehensively, the organic buffer layer can be completely confined within the range of the buffer strip, thereby a use of the barrier wall can be eliminated, and a package structure can be greatly improved.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic light emitting diode (OLED) display panel, wherein the display panel comprises:
    a display structure and an encapsulation structure, the display structure comprising a display region and an edged non-display region surrounding the display region, the display region comprising an OLED layer, the encapsulation structure being disposed on the edged non-display region;
    wherein the encapsulation structure comprises a buffer strip connected to the display region and a sealing layer covering the display region and the buffer strip;
    wherein a surface of the buffer strip has an uneven three-dimensional structure, the three-dimensional structure has protruded portions and recessed portions, and the protruded portions and the recessed portions are uniformly arranged and spaced apart from each other;
    wherein the sealing layer comprises a first barrier layer directly covering the display region and the buffer strip, and a second barrier layer over the first barrier layer;
    wherein the first barrier layer is an inorganic thin film, and the second barrier layer is an organic film;
    wherein the sealing layer further comprises a first buffer layer between the first barrier layer and the second barrier layer; and
    wherein a surface of the first barrier layer has an uneven three-dimensional structure toward the second barrier layer.

2. The OLED display panel according to claim 1, wherein, a material of the first barrier layer is any one of silicon nitride, silicon oxynitride, silicon carbonitride, silicon oxide, and aluminum oxide, and a material of the organic film is a polyester woven fabric or a fluorocarbon polymer.

3. The OLED display panel according to claim 2, wherein a sealing layer further comprises a third barrier layer above the second barrier layer, the third barrier layer is an inorganic thin film, and a material of the third barrier layer is any one of silicon nitride, silicon oxynitride, silicon carbonitride, silicon oxide, and aluminum oxide.

4. The OLED display panel according to claim 3, wherein the sealing layer further comprises a first buffer layer between the first barrier layer and the second barrier layer, and the first buffer layer is a layer of hydrophobic material having a porous structure.

5. The OLED display panel according to claim 4, wherein the sealing layer further comprises a second buffer layer between the second barrier layer and the third barrier layer, and the second buffer layer is a layer of hydrophobic material having a porous structure.

6. The OLED display panel according to claim 5, wherein material of the first buffer layer and the second buffer layer has water contact angles greater than 140°.

7. The OLED display panel according to claim 6, wherein material of the first buffer layer and the second buffer layer is a polyester textile or a fluorocarbon polymer.

8. An organic light emitting diode (OLED) display panel, wherein the display panel comprises:
a display structure and an encapsulation structure, the display structure comprising a display region and an edged non-display region surrounding the display region, the display region comprising an OLED layer, the encapsulation structure being disposed on the edged non-display region;
wherein the encapsulation structure comprises a buffer strip connected to the display region and a sealing layer covering the display region and a buffer strip;
wherein a surface of the buffer strip has an uneven three-dimensional structure, the three-dimensional structure has protruded portions and recessed portions, and the protruded portions and the recessed portions are uniformly arranged and spaced apart from each other
wherein the sealing layer comprises a first barrier layer directly covering the display region and the buffer strip, and a second barrier layer over the first barrier layer;
wherein the first barrier layer is an inorganic thin film, and the second barrier layer is an organic film; and
wherein the sealing layer further comprises a first buffer layer between the first barrier layer and the second barrier layer, and the first buffer layer is a layer of hydrophobic material having a porous structure.

9. The OLED display panel according to claim 8, wherein the encapsulation structure further comprises at least one annular dam surrounding the buffer strip, and the dam is positioned below the sealing layer.

10. The OLED display panel according to claim 9, wherein a material of the first barrier layer is any one of silicon nitride, silicon oxynitride, silicon carbonitride, silicon oxide, and aluminum oxide, and a material of the second barrier layer is a polyester woven fabric or a fluorocarbon polymer.

11. The OLED display panel according to claim 10, wherein the sealing layer further comprises a third barrier layer above the second barrier layer, the third barrier layer is an inorganic thin film, and a material of the third barrier layer is any one of silicon nitride, silicon oxynitride, silicon carbonitride, silicon oxide, and aluminum oxide.

12. The OLED display panel according to claim 8, wherein the sealing layer comprises a first barrier layer directly covering the display region and the buffer strip, and a second barrier layer over the first barrier layer.

13. The OLED display panel according to claim 8, wherein the sealing layer further comprises a second buffer layer between the second barrier layer and the third barrier layer, and the second buffer layer is a layer of hydrophobic material having a porous structure.

14. The OLED display panel according to claim 13, wherein materials of both the first buffer layer and the second buffer layer have water contact angles greater than 140°.

15. The OLED display panel according to claim 14, wherein materials of each of the first buffer layer and the second buffer layer are polyester textiles or fluorocarbon polymers.

16. A method of fabricating an organic light emitting diode (OLED) display panel, wherein the method comprises the steps of:
providing a substrate;
forming a display structure on the substrate, the display structure comprising a display region and an edged non-display region surrounding the display region, the display region comprising an OLED layer;
providing a buffer strip connected to the display region and the non-display region, a surface of the buffer strip has an uneven three-dimensional structure, the three-dimensional structure has protruded portions and recessed portions, and the protruded portions and the recessed portions are uniformly arranged and spaced apart from each other;
forming a dam surrounding the buffer strip;
forming a sealing layer covering the display region, the buffer strip, and the dam, the sealing layer comprising a first barrier layer directly covering the display region, the buffer strip and the dam, a second barrier layer positioned above the first barrier layer, and a third barrier layer positioned above the second barrier layer;
wherein a surface of the first barrier layer has an uneven three-dimensional structure toward the second barrier layer.

* * * * *